United States Patent
Norskov et al.

(10) Patent No.: US 6,835,602 B2
(45) Date of Patent: Dec. 28, 2004

(54) COILS INTEGRATED IN IC-PACKAGE

(75) Inventors: Soren Norskov, Copenhagen (DK); Carsten Rasmussen, Copenhagen (DK)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 10/172,000

(22) Filed: Jun. 17, 2002

(65) Prior Publication Data

US 2002/0151109 A1 Oct. 17, 2002

Related U.S. Application Data

(62) Division of application No. 09/684,950, filed on Oct. 10, 2000, now Pat. No. 6,465,896.

(30) Foreign Application Priority Data

Oct. 8, 1999 (GB) ............................................. 9923928

(51) Int. Cl.[7] .............................................. H01L 21/50
(52) U.S. Cl. ....................................... 438/118; 257/784
(58) Field of Search ................................ 257/690–691, 257/784, 786, 773–775, 531; 438/118

(56) References Cited

U.S. PATENT DOCUMENTS

| | | | |
|---|---|---|---|
| 5,309,019 A | | 5/1994 | Moline et al. ............... 257/670 |
| 5,462,624 A | | 10/1995 | Kwon ........................ 156/257 |
| 5,798,571 A | | 8/1998 | Nakajima .................... 257/784 |
| 6,072,232 A | * | 6/2000 | Li et al. ...................... 257/680 |
| 6,140,708 A | * | 10/2000 | Lee et al. .................... 257/780 |
| 6,191,359 B1 | * | 2/2001 | Sengupta et al. .......... 174/52.3 |
| 6,353,326 B2 | * | 3/2002 | Hembree et al. ........... 324/755 |

FOREIGN PATENT DOCUMENTS

| | | |
|---|---|---|
| JP | 6218747 | 8/1994 |
| JP | 7226333 | 8/1995 |

OTHER PUBLICATIONS

"A 1.8 Ghz CMOS Low Pressure–Phase–Noise Voltage–Controlled Oscillator with Prescaler", by Craninckx et al 1995, IEEE vol. 30, No. 12.

* cited by examiner

*Primary Examiner*—David Nelms
*Assistant Examiner*—David Vu
(74) *Attorney, Agent, or Firm*—Antonelli, Terry, Stout & Kraus, LLP

(57) ABSTRACT

Method for providing at least one inductance associated with a chip attached to a support, in which said inductances are provided by means of at least a first bondwire having first and second ends. In which method said first end of said first bondwire is bonded to a first pad on said chip by means of an automated process using the chip as a reference for placing the first end of the first bondwire on the first pad when bonding it thereto. The second end of said first bondwire is bonded to a second pad on said support by means of the automated process using the chip as a reference for placing the second end of the first bondwire on the second pad when bonding it thereto.

11 Claims, 2 Drawing Sheets

COILS INTEGRATED IN IC-PACKAGE

The present application is a divisional application of application Ser. No. 09/684,950, filed Oct. 10, 2000 now U.S. Pat. No. 6,465,895, the contents of which are incorporated herein by reference.

BACKGROUND OF THE INVENTION

The present invention relates to a method for providing at least one inductance associated with a chip attached to a support, in which said inductances are provided by means of at least a first bondwire having first and second ends, and in which said first end of said first bondwire is bonded to a first pad on said chip by means of an automated process using the chip as a reference for placing the first end of the first bondwire on the first pad when bonding it thereto.

Integrated circuit packages usually consist of at least one semiconductor chip, which is often referred to as a die, and electrical conductors providing the communication to the exterior. The chip is mounted on a support, e.g., an interposer or a lead-frame, by means of gluing or a similar fastening method. To finish the package, the assembly of chip, support and electrical conductors, is moulded in by means of an appropriate plastic material, thus sealing the assembly and leaving only terminals in the form of pads or pins protruding to the exterior. Alternatively the sealing can be made by fastening a cover made of plastic, a ceramic material, or some other appropriate material, to the support.

The electrical conductors providing the communication to the exterior, are usually made from gold or aluminum threads, which are at one end connected to terminal pads on the chip, and at the other end connected to metal plated pads on the support, the pads themselves being connected to the exterior in some manner. These threads are commonly referred to as bondwires.

All conductors, and thus also the bondwires, exhibit an inductance. However, since the bondwires are relatively short, their inductance is so small that it is not of importance at low frequencies. For this reason the inductance of the bondwires has largely been ignored.

In connection with chips working at radio frequencies (RF), or otherwise designed for RF applications, the inductances cannot be ignored. This gives the circuit designer the choice of either minimizing the inductive effect of the bondwires, or deliberately target the inductance of the bondwires for the use as a circuit component.

The use of bondwires to provide specific inductances, is suggested in the article "A I 0.8-GHz CMOS Low-Phase-Noise Voltage-Controlled Oscillator with Prescaler", Craninckx, J. and Steyaert, M. S. J., IEEE JOURNAL OF SOLID-STATE CIRCUITS, vol. 30, No. 12, Dec. 1995, pages 1474 to 1482. The article states that to be able to predict the inductance value as correctly as possibly the length of the bond wires must be controlled accurately, because the length of the bondwire is the main factor determining its inductance. As a solution the article suggests the use of on-chip bond wires.

U.S. Pat. No. 886,393 also deals with the use of bondwires for providing an inductance. In this patent the bondwires are looped around between pads on the chip or the support to form a coil. The problem of inductance precision is not dealt with in the patent.

The use of on-chip bondwires provides quite predictable results because the pads are situated on the chip and their relative position thus fixed with the high accuracy of the chip manufacturing process. Since the distance between the pads is well known, the length of bondwire, and thus the inductance, is predictable.

The on-chip approach though, has one major drawback, namely how to bond the second end of the bondwire to the chip. Ends of bondwires are normally connected to pads using one of two methods, ball-bonding and wedge-bonding. Ball-bonding is normally used to bond the first end of the bondwire to a pad on the chip, wedge-bonding is normally used to bond the second end of the bondwire to a pad on the support. A wedge-bond places considerable stress on the pad, and is normally not considered suitable for use on the chip. Thus, if a wedge-bond is used to connect the second end of the bondwire to the chip, special precautions must be taken not to damage the chip. If a ball-bond is used the procedure is quite complicated, the wire must be severed and end heated to form a ball, then the end must be placed on the pad and bonded. The procedure of making a second ball-bond is so complicated that it rarely, if ever, is used for mass production. Either way this makes the approach expensive.

Another drawback of placing all the pads are on the chip, is that they take up a large portion of the chip area, which is then wasted.

Placing all bondwire inductors on another surface with more rugged pads 20 leaves the problem of connecting the inductor.

In a hybrid solution where some of the pads are placed on the chip and others on another surface inside of the IC package, e.g. on the support, the value of the inductors becomes less predictable.

This is due to the fact that the positioning of the chip on the support in the IC package, using standard production methods, has much wider tolerances than the positioning of a pad on the chip. This tolerance is compensated for by the bondwire.

The way this compensation is effected is that when the first end of the bondwire is placed on the pad on the chip the positioning is done relative to the chip, whereas when the second end of the bondwire is placed on the pad on the support this is done relative to the support.

In this way the positioning of both ends of the bondwire is correct, with regard to the respective pad to which it is attached, even if the position of the chip on the support deviates from one IC package to another.

The result being that the tolerances on the positioning of the chip on the support in the IC package is reflected in the length of the bondwires and thus in their inductance, the inductance of a bondwire being roughly 1 Nh/mm.

SUMMARY OF THE INVENTION

According to a first aspect of the invention there is established a method for providing at least one inductance associated with a chip attached to a support, in which said inductances are provided by means of at least a first bondwire having first and second ends, and in which said first end of said first bondwire is bonded to a first pad on said chip by means of an automated process using the chip as a reference for placing the first end of the first bondwire on the first pad when bonding it thereto, characterized in that said second end of said first bondwire is bonded to a second pad on said support by means bf the automated process using the chip as a reference for placing the second end of the first bondwire on the second pad when bonding it thereto. The object of the present invention is to overcome the above problems in providing well defined inductances associated with a chip.

In other words, according to the invention the problems outlined above are solved by placing the first end of the bondwire on the chip and the second end of the bondwire on the support and positioning both ends of the bonding wire relative to the chip. In order to use the chip as a reference of both ends of the bonding wire, it is however necessary to enlarge the connection pads on the support accordingly so as to compensate for the tolerances.

According to a second aspect of the invention there is provided an integrated circuit package including a chip, a support to which the chip is attached, and at least one bondwire extending from a first pad on the chip to a second pad on the support and electrically connecting the first and the second pads, characterized in that the smallest dimension on the second pad is at least six times the diameter of the bondwire.

Thus, with the invention, the length of the bondwire remains the same from one IC package to another, but in the different IC packages the second end of the bondwire will be positioned in different places on the respective pad on the support to which it is attached. The only compromise necessary is the use of enlarged connection pads, but enlarging these pads will not pose any problems, since usually the IC package, and in particular the supporting surface for the enlarged connection pads is much larger than the chip itself, thus providing ample room for the bondwires.

Further the support is much less expensive, compared to the chip, because the support basically is comparable with a printed circuit board, whereas the chip itself is a high precision semiconductor part.

The invention will now be explained in greater detail by means of a non-limiting exemplary embodiment, and the drawings.

DETAILED DESCRIPTION OF THE INVENTION

Figure 1:
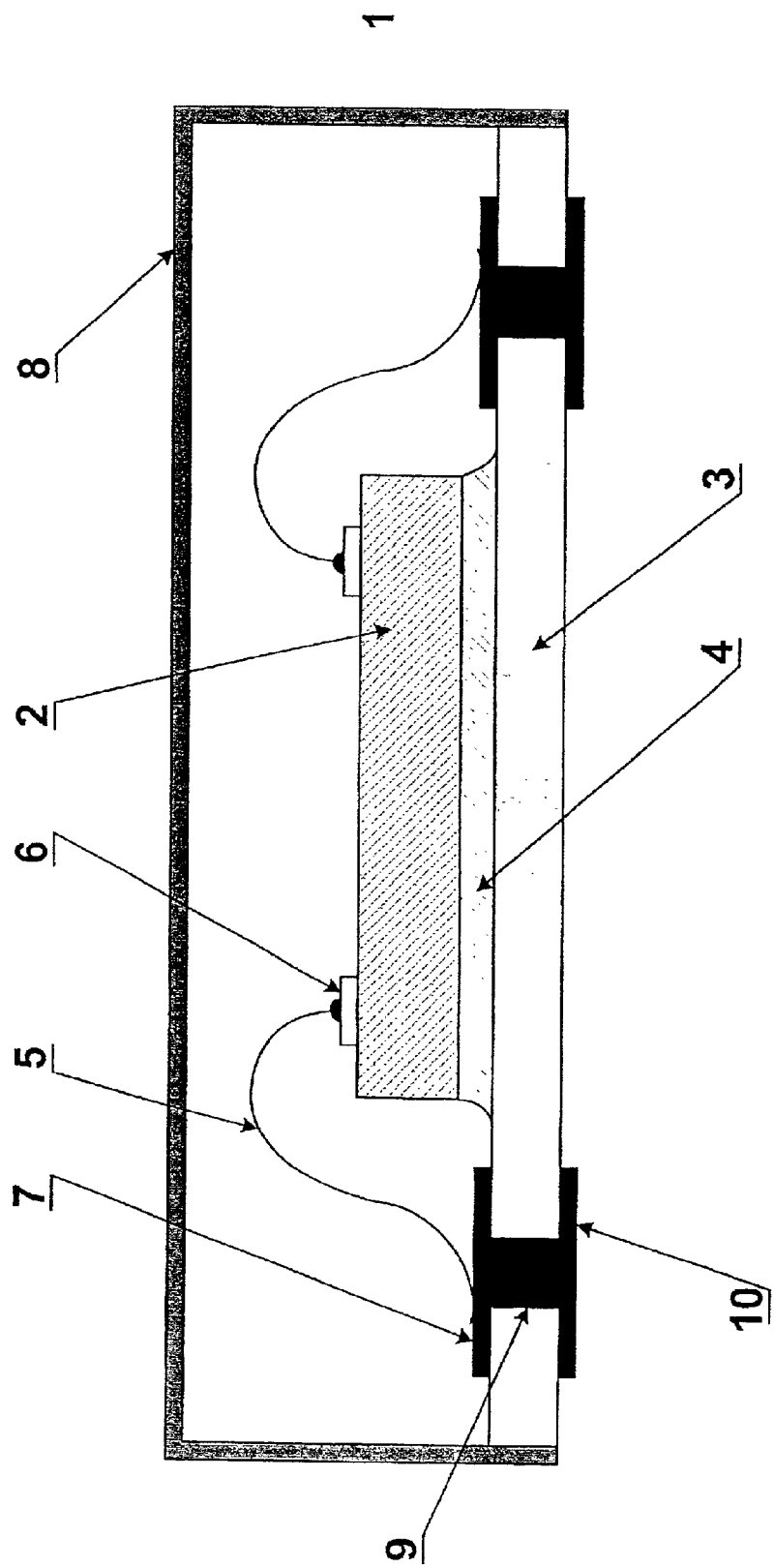
FIG. 1 schematically shows a cross section of a chip and a support connected by bondwires. In the preferred embodiment the support has the form of an interposer.

In FIG. 1 there is schematically shown a cross section of an IC package 1. The package 1 includes a chip 2, which is mounted on a interposer 3. In the preferred embodiment the chip 2 is glued to an upper surface of the support 3, by means of glue 4.

After the chip 2 has been glued to the upper surface of the interposer 3 electrical connections are formed between the chip 2 and the interposer 3. The electrical connections are formed by means of bondwires 5 which are at their one end attached to pads 6 on the chip, and at their other to pads 7 on the interposer 3.

The bondwires 5 are usually gold or aluminium threads, with a diameter of approximately 25–50 $\mu$m. Typically the pads 6 on the chip 2 to which the bondwires are attached are squares with a side length of about 3 times the diameter of the bondwire 5. The precision with which bondwire is attached to the pads 6 on the chip 2 is typically +1–10~m on both the X and the Y coordinate.

Finally after the bondwires 5 have been attached, the whole assembly of chip 2, bondwires S and interposer 3, or at least the upper surface thereof, are moulded in by means of an appropriate plastic material 8. Connections from the pads 7 to the exterior is provided by means of vias 9, which electrically connect the pads 7 to pads 10 on the lower surface of the interposer 3. The vias 9 are metal plated through holes in the insulating board acting as base material for the interposer.

The pads 10 on the lower side of the may be terminals for input, output or ground etc.

Eventually when the IC package 1 is mounted on a printed circuit board (not shown) of a device, electrical connections are made by means of soldering, conductive glue or the like between the pads 10 and corresponding pads on the printed circuit board.

Figure 2:
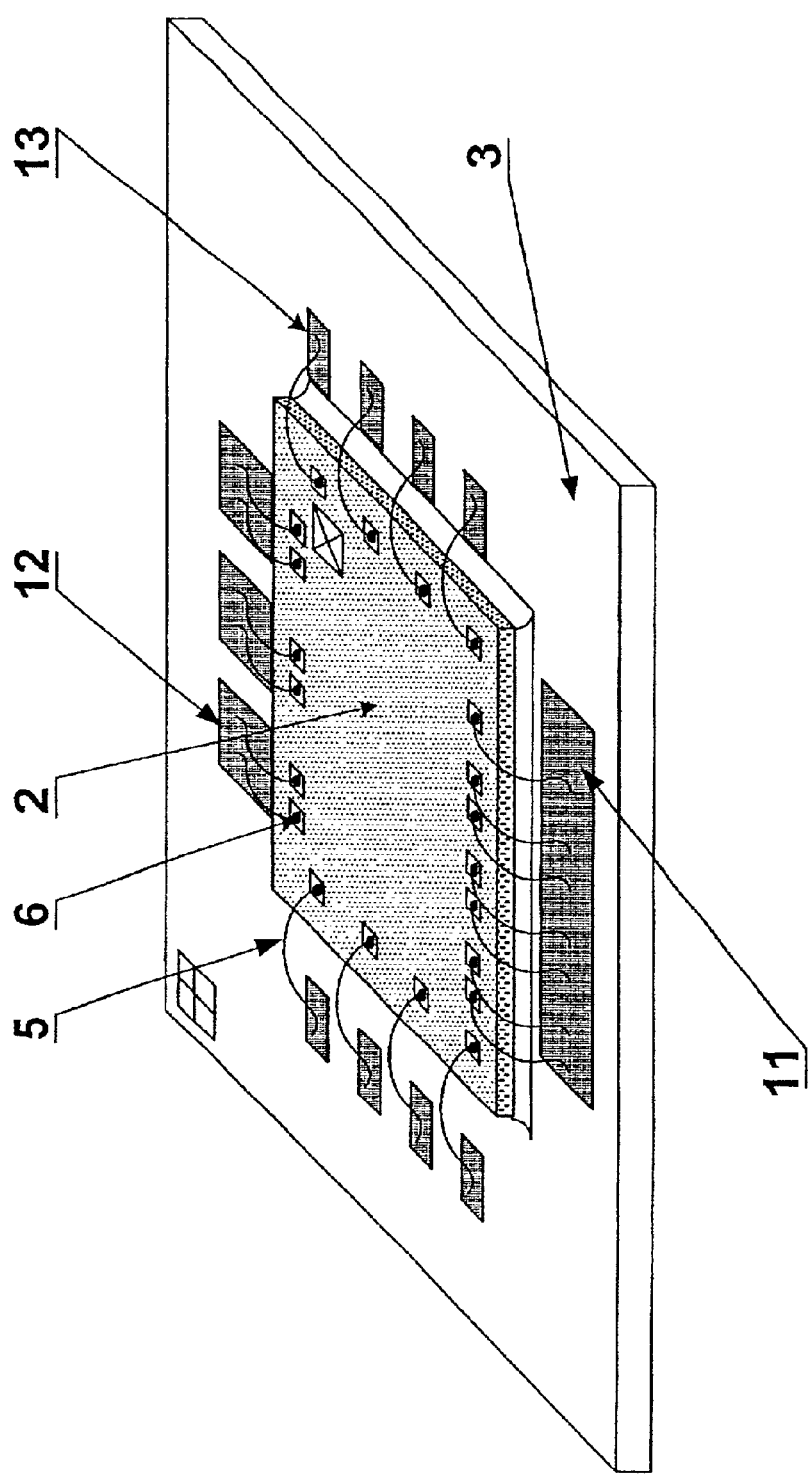
FIG. 2 schematically shows a top plan view of a chip and an interposer connected by bondwires.

FIG. 2 schematically shows a perspective top view of a chip 2 mounted on an interposer 3 and connected electrically connected thereto by means of bondwires 5 from pads 6 on the chip to pads 11, 12, 13 on the interposer 3.

As indicated earlier, the present invention deals with the inevitable inductances of the bondwires 5, and in particular with how to control the inductance value of the bondwires 5, because these cannot be neglected in RF applications.

In FIG. 2 there is shown various types of connections between the chip 2 and the interposer 3 may be formed.

Some of the connections, such as e.g. the connections from the chip 2 to the 30 pads 11 or 12 may be deliberately targeted for the use as inductances in the RF application of the chip 2, whereas others 13 may constitute connections where an inductance is not desired yet inevitable.

In either case it is of great interest to know the value of the inductance with 5 the greatest possible precision in order be able to take it into account a priori when designing the chip 2.

In the exemplary case shown, the two bondwire connections from different pads 6 on the chip 2 to a common pad 12, form a loop together with the pad 12 itself, and thus basically provide a one turn coil.

As will be seen plural bondwires 5 connect pads 6 on the chip 2 to a large contact area or pad 11. Each of these bondwires may form an inductance. These inductances may largely be independent of each others because the contact area 11 constitutes ground or RF ground.

It should however be noticed that the vias 9 can be omitted in certain cases, e.g., if a loop such as the one associated with pad 12 is formed, the pad 12 need not have a via to the other side of the carrier.

It should further be noted, that even though not shown in the figures it is possible draw a bondwire 5 from the pad 6 on the chip 2 to a pad 7, 11, 12, 13 on via one or more intermediate pads. i.e., drawing a first length of bondwire 5 to the intermediate pad, and subsequently drawing a second length of bondwire 5 to a pad 13, where the connection to the exterior is made. In this case the pad 13 may be associated with a via, whereas the intermediate pad need not.

Using several intermediate pads it is further possible to form larger loop coils between two pads 6 on the chip, than possible when using only one pad 12, as will be described below.

Conventionally the chip 2 is placed on the interposer 3 by means of an automated process, e.g., using a robot. In order not to increase costs this is done with much less precision compared to the precision in the bonding process. A typical value for the precision with which the chip 2 is placed on the interposer 3 is +/−150$\mu$.

Both of these tolerances are far more coarse than the precision of position of the pads 6 relative to the chip 2. This is due to the fact that the precision on the pads 6 relative to the chip 2 is determined with the same high precision with which the remaining patterns are manufactured on the chip 2.

When the chip 2 has been placed on the interposer 3 and glued thereto, the bonding takes place, in an automated bonding machine. The bonding machine is program controlled.

In order to accurately place the first end of the bondwire on the respective pad 6 on the chip 2, the pattern recognition uses a recognizable pattern on the chip 2. This may be a pattern consisting of a number of the pads 6 themselves, or it may be a specific purpose made recognizable pattern. The pattern being provided with the same precision on the chip 2 as the pads 6.

The bondwire 5 is then drawn to the desired pad 7, 11, 12, 13 on the interposer 3, where it is attached and severed.

According to the invention the pads 7, 11, 12, 13 on the interposer 3 have sizes which allow the bonding machine to attach the second end of a predetermined length of bondwire 5 to them, even if the position of the chip 2 on the interposer 3 is off-set from a nominal position. i.e., if the chip 2 is placed off-set from a nominal position, the desired length of wire may still be drawn in the predetermined direction towards the pad 7, 11, 12, 13 on the interposer 3 and attached to this pad 7, 11, 12, 13. In the applications contemplated the typical length of the bondwire 5 is 0.5–2 mm, but the invention is of course not limited to such lengths.

Since, as mentioned above, the precision with which the chip 2 is placed on 10 the interposer 3 is approximately +/−150$\mu$ and the thickness of the bondwire is approximately 25–50$\mu$, the pads 7, 11, 12, 13 on the interposer must at least have a smallest dimension of approximately 300$\mu$, corresponding to at least six times the diameter of the bondwire 5. However, preferably the lower diameter of 25$\mu$ for the bondwire 5 is used and the smallest dimension on the pads 7, 11, 12, 13 should thus be at least twelve times the diameter of the bondwire 5. However it is further desired to have some additional margin on the tolerances it is more preferred that the smallest dimension on the pads 7, 11, 12, 13 is at least fifteen times the thickness of the bondwire 5.

This allows the bonding machine to use only one reference, namely the one on the chip 2, and still attach the bondwires on the pads 6, 11, 12, 13 on the interposer 3. i.e., it may attach the bondwires in accordance with their predetermined configuration resulting in the desired lengths based on a nominal position of the chip 2, because even if the chip 2 deviates in its position from the desired predetermined position on the interposer 3, the attachment point of the second end of the bondwire 4 will still be within the area of the pads 7, 11, 12, 13 on the interposer 3. The attachment point of the second end of the bondwire 5 is then off-set from its nominal attachment point on the pads 7, 11, 12, 13 with an amount corresponding to the off-set of the chip 2 on the interposer 3.

The enlarged areas of the pads 7, 11, 12, 13 on the interposer 3, however, do not influence the inductances substantially.

Further they can be provided at low cost, because space on the interposer is not so costly as on the chip.

Hence bondwire inductances with precise values may be provided at lower costs than it is possible with the on-chip solutions of the prior art. For the attachment of the bondwires 5 to the chip 2 and the interposer 3 any conventional process may be employed e.g., ultrasonic bonding, thermocompression bonding, such as ball-bonding or wedge-bonding, any hybrid thereof.

The fact that all first ends of all wires are attached to the pads 6 on the chip 2, and all second ends are attached to the pads 7, 11, 12, 13 on the interposer 3, provides the further advantage that the first free end of the bondwire 5 can be attached to the chip without risk of damaging it. The bondwire 5 can then be attached to the pads 7, 11, 12, 13 on the interposer 3 and severed, so as to provide a new free end. The severing action, which may be a pressing and scraping action, is of no risk of damaging the chip, because it only takes place on the interposer 3. The risk of damaging the pads 7, 11, 12, 13 on the interposer 3 in the severing action is less pronounced, because the pads 7, 11, 12, 13 are larger and substantially more rugged than the pads 6 on the chip 2.

The invention is not limited to the above described and in the drawings shown examples of an embodiment but can be varied within the scope of the appended claims.

What is claimed is:

1. A method of providing at least one inductance associated with an integrated chip attached to a support, comprising the steps of:

providing said at least one inductance by at least a first bondwire having first and second ends, bonding said first end of said first bondwire to a first pad on the chip by an automated process using the chip as a reference for placing said first end of said first bondwire on said first pad when bonding said first pad thereto; and bonding said second end of said first bondwire to a second pad on the support by the automated process using the chip as a references for placing said second end of said first bondwire on the second pad when bonding said second pad thereto, wherein bonding said first and second ends of first bondwire using the chips as a reference adjusts a value of said at least one inductance.

2. A method according to claim 1, wherein said second end of said first bondwire is severed by scraping on said second pad on said support.

3. A method according to claim 2, wherein said second pad constitutes a pad which is electrically connected to an exterior of an integrated circuit package including the chip.

4. A method according to claim 2, further comprising the steps of:

bonding a first end of a second bondwire to a third pad on the chip, and bonding a second end of said second bondwire to said second pad on the support by an automated process using the chip as a reference for placing said first and second bondwire on said second and third pads, respectively, when bonding them thereto.

5. A method according to claim 2, further comprising the steps of:

bonding a first end of a second bondwire to said second pad on the support, and bonding a second end of said second bondwire to a fourth pad on the support by an automated process using the chip as a reference for placing first and second bondwires to said second and fourth pads, respectively, when bonding them thereto.

6. A method according to claim 1, further comprising the steps of:

bonding a first end of a second bondwire to a third pad on the chip, bonding a second end of said second bondwire to said second pad on the support by an automated process using the chip as a reference for placing said first and second bondwires on said second and third pads, respectively, when bonding them thereto.

7. A method according to claim 1, further comprising the steps of:
  bonding a first end of a second bondwire to said second pad on the support, and
  bonding a second end of said second bondwire to a fourth pad on the support by an automated process using the chip as a reference for placing first and second bondwires to the second and fourth pads, respectively, when bonding them thereto.

8. A method according to claim 7, wherein the fourth pad constitutes a pad which is electrically connected to an exterior of an integrated circuit package including the chip.

9. A method according to claim 8, wherein the support has at least one connector, and said fourth pad is electrically connected to a fifth pad on the opposite side of the support by said at least one connector.

10. A method according to claim 7, wherein the support has at least one connector, and the fourth pad is electrically connected to a fifth pad on the opposite side of the support by said at least one connector.

11. A method according to claim 10, wherein said fifth pad is on an outside of the integrated circuit package including said chip.

* * * * *